United States Patent
Yong et al.

(10) Patent No.: US 9,006,063 B2
(45) Date of Patent: Apr. 14, 2015

(54) TRENCH MOSFET

(71) Applicants: STMicroelectronics S.r.l., Agrate Brianza (IT); STMicroelectronics Asia Pacific Pte, Ltd., Singapore (SG)

(72) Inventors: Yean Ching Yong, Singapore (SG); Stefania Fortuna, AciBonaccorsi (IT)

(73) Assignees: STMicroelectronics S.r.l., Agrate Brianza (IT); STMicroelectronics Asia Pacific Pte Ltd, Singapore (SG)

( * ) Notice: Subject to any disclaimer, the term of this patent is extended or adjusted under 35 U.S.C. 154(b) by 0 days.

(21) Appl. No.: 13/931,637

(22) Filed: Jun. 28, 2013

(65) Prior Publication Data

US 2015/0001615 A1   Jan. 1, 2015

(51) Int. Cl.
| | |
|---|---|
| *H01L 21/8242* | (2006.01) |
| *H01L 21/336* | (2006.01) |
| *H01L 21/265* | (2006.01) |
| *H01L 29/423* | (2006.01) |
| *H01L 29/66* | (2006.01) |
| *H01L 29/78* | (2006.01) |

(52) U.S. Cl.
CPC .......... *H01L 21/265* (2013.01); *H01L 29/4232* (2013.01); *H01L 29/66666* (2013.01); *H01L 29/7827* (2013.01)

(58) Field of Classification Search
USPC ......... 438/268, 589, 751–757, 723, 138, 270, 438/242, 246, 248, 56, 700, 212; 257/238, 257/302, 331, 329, 341, 333, 212, E27.091, 257/E29.201, E21.551, E21.655
See application file for complete search history.

(56) References Cited

U.S. PATENT DOCUMENTS

| | | | | |
|---|---|---|---|---|
| 5,077,228 A | * | 12/1991 | Eklund et al. | 438/270 |
| 5,445,988 A | * | 8/1995 | Schwalke | 438/432 |
| 5,814,858 A | * | 9/1998 | Williams | 257/328 |
| 5,918,114 A | * | 6/1999 | Choi et al. | 438/134 |
| 6,657,254 B2 | * | 12/2003 | Hshieh et al. | 257/330 |
| 6,887,760 B2 | * | 5/2005 | Curro' et al. | 438/268 |
| 6,969,888 B2 | * | 11/2005 | Williams et al. | 257/341 |
| 7,052,963 B2 | * | 5/2006 | Williams et al. | 438/268 |
| 7,075,145 B2 | * | 7/2006 | Williams et al. | 257/329 |
| 7,842,574 B2 | * | 11/2010 | Arena et al. | 438/270 |
| 2007/0063272 A1 | * | 3/2007 | Arena et al. | 257/330 |
| 2007/0145474 A1 | * | 6/2007 | Annese et al. | 257/329 |
| 2009/0026533 A1 | * | 1/2009 | Hshieh | 257/330 |
| 2011/0089486 A1 | * | 4/2011 | Xu et al. | 257/330 |
| 2013/0001678 A1 | * | 1/2013 | Barletta | 257/330 |

* cited by examiner

*Primary Examiner* — Evan Pert
*Assistant Examiner* — Gustavo Ramallo
(74) *Attorney, Agent, or Firm* — Seed IP Law Group PLLC

(57) ABSTRACT

A method for forming a trench MOSFET includes doping a body region of the trench MOSFET in multiple ion implantation steps each having different ion implantation energy. The method further comprises etching the trench to a depth of about 1.7 μm.

17 Claims, 18 Drawing Sheets

TRENCH MOSFET

BACKGROUND

1. Technical Field

The present disclosure relates to the field of MOS transistors. The present disclosure relates more particularly to the field of trench MOSFETs.

2. Description of the Related Art

Trench MOSFETs are a type of vertical MOSFET in which the source region is at a top surface of a semiconductor substrate and the drain region is at a bottom surface of a semiconductor substrate. A body region is formed in the semiconductor substrate between the source and the drain. A trench is etched in the semiconductor substrate having sidewalls along the source and body regions. The trench is filled with polysilicon to form a gate electrode.

For a PMOS device, it is beneficial to dope the polysilicon of the gate electrode with P type ions to reduce the value of the work function between the polysilicon and the silicon of the substrate. The threshold voltage for turning on the transistor is dependent on the work function of the transistor. The lower the work function, the lower the threshold voltage can be.

In some cases it can be very difficult to dope the polysilicon with P type dopant ions. Non-in situ P type doping requires very large thermal budgets. First, boron is implanted into the polysilicon by ion implantation. Afterwards, a diffusion step is performed to diffuse the boron into the deep portions of the trench. This diffusion step requires heating the device to very high temperatures. If the temperature is too high, the gate oxide can be contaminated with boron, leading to the possibility that the gate oxide will not perform reliably. If the temperature is not high enough, the boron will not diffuse all the way into the polysilicon in the trench. This can lead to poor conductivity of the gate electrode, causing poor performance of the trench MOSFET. It can be very difficult to precisely control the temperature during diffusion of the boron into the gate electrode.

FIG. 1A is a cross-section of semiconductor substrate 20 in which will be formed a P type trench MOSFET. The semiconductor substrate 20 includes a highly doped P type drain region 24, and a lightly doped P type drain region 26. N type dopant ions are being implanted in a single implantation step into the semiconductor substrate 20 to form a transistor body region 27 that is doped N type. The dopant ions are being implanted with an implantation energy of 340 keV.

In FIG. 1B, highly doped deep body regions 31 are formed by implanting type dopant ions in small pockets on the far left and right sides of the body region 27. The dopant ions in FIG. 1B are implanted with an implantation energy of 340 keV.

In FIG. 1C, highly doped body contact regions 34 have been formed. Highly doped P type source regions 36 have also been formed adjacent the body contact regions 34. A trench 39 has been etched in the semiconductor substrate 20. The trench 39 is about 1.3 μm deep. The trench 39 is lined with a gate oxide layer 41. Polysilicon has been deposited in the trench 39 to form a gate electrode 43.

In FIG. 1C, P type dopant ions, for example boron, are implanted into the polysilicon gate electrode 43. The P type dopant ions are implanted having a relatively low energy so that they do not puncture through the gate oxide 41 and enter the highly doped source and body regions 36, 34, respectively. As described previously, after the ions are implanted into the polysilicon gate electrode 43, the diffusion step is performed to diffuse the dopant ions deeper into the trench 39 by heating the semiconductor substrate 20 to a particular high temperature.

In order to protect the gate electrode from being degraded by boron diffusion, it can be necessary to have gate oxide nitridization or $N_2$ presence at the interface of the polysilicon and the gate oxide. This additional step further increases the cost of manufacturing the trench MOSFET.

BRIEF SUMMARY

One embodiment is a method for forming a trench MOSFET. The method includes doping the body region of the trench MOSFET in multiple ion implantation steps at different ion implantation energies. This allows for the uniform dopant concentration in the body region of the trench MOSFET adjacent the gate oxide. The method also includes etching a relatively deep trench for the trench MOSFET in order to shift the electric field peak deeper and to decrease the electric field in the low body doped region.

In one embodiment, the method includes forming a relatively deep body region by implanting dopant ions with a relatively high energy. This decreases the electric field and shifts the region in which breakdown can occur deeper into the semiconductor substrate.

In one embodiment the trench is filled with polysilicon and doped in situ with N type dopants. This allows for thinner gate oxide and no nitridization.

DETAILED DESCRIPTION

Figure 2A:
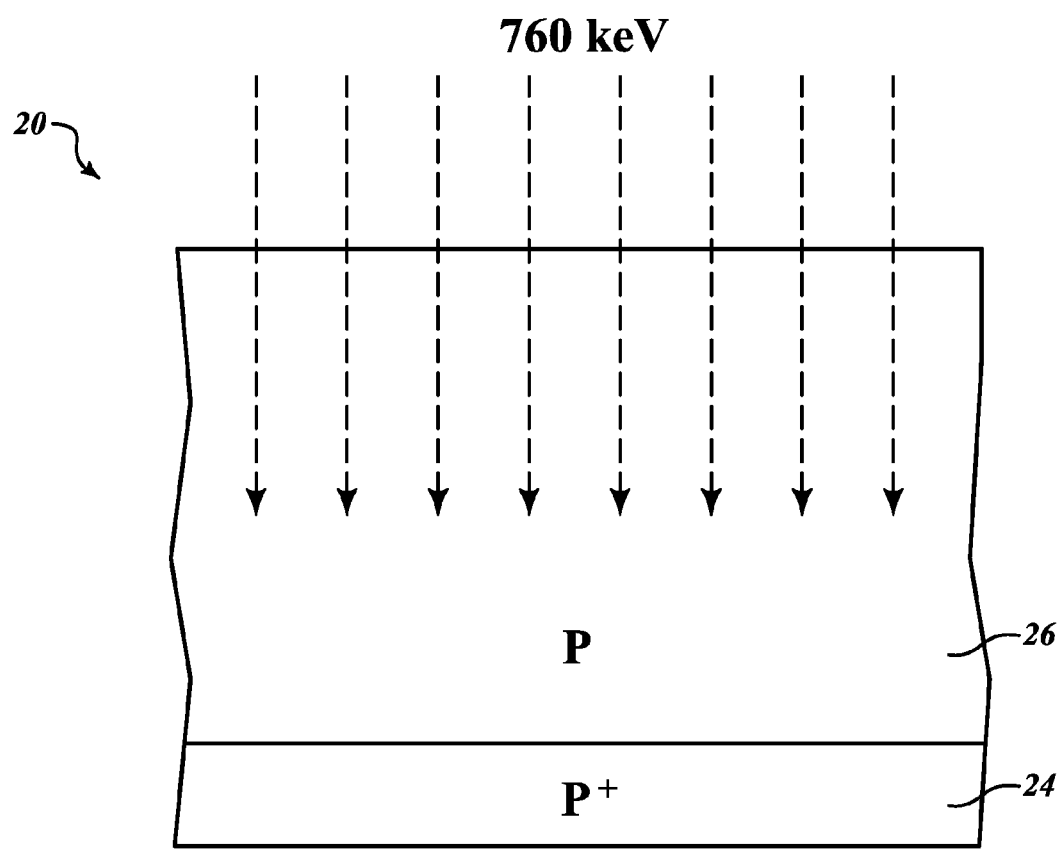
FIG. 2A is a cross-section of a trench MOSFET during a first body dopant implantation according to one embodiment.

FIG. 2A is a cross-section of a semiconductor substrate 20 in an intermediate stage of forming a P-channel trench MOSFET therein according to one embodiment. The semiconductor substrate includes a highly doped drain region 24 and a less highly doped drain region 26. The drain regions 24, 26 are both doped with P type dopant atoms. In one example the drain regions 24, 26 are doped with boron atoms.

FIG. 2A further illustrates the doping of the body region above the drain region 26. N type dopant ions are implanted into the semiconductor substrate 20 by an ion implantation process. In the ion implantation process N type dopant atoms are driven with an implantation energy toward the semiconductor substrate 20. The magnitude of the implantation energy determines the speed with which and the depth to which the dopant ions are driven toward the semiconductor substrate 20. The more energetic the ions are, the deeper they are implanted into the semiconductor substrate 20.

In the example of FIG. 2A, phosphorus dopant ions are implanted in the semiconductor substrate 20 with an implantation energy of 760 keV. This is in contrast to the body implantation energy of 340 keV described in relation to the process of FIG. 1A.

Figure 2B:
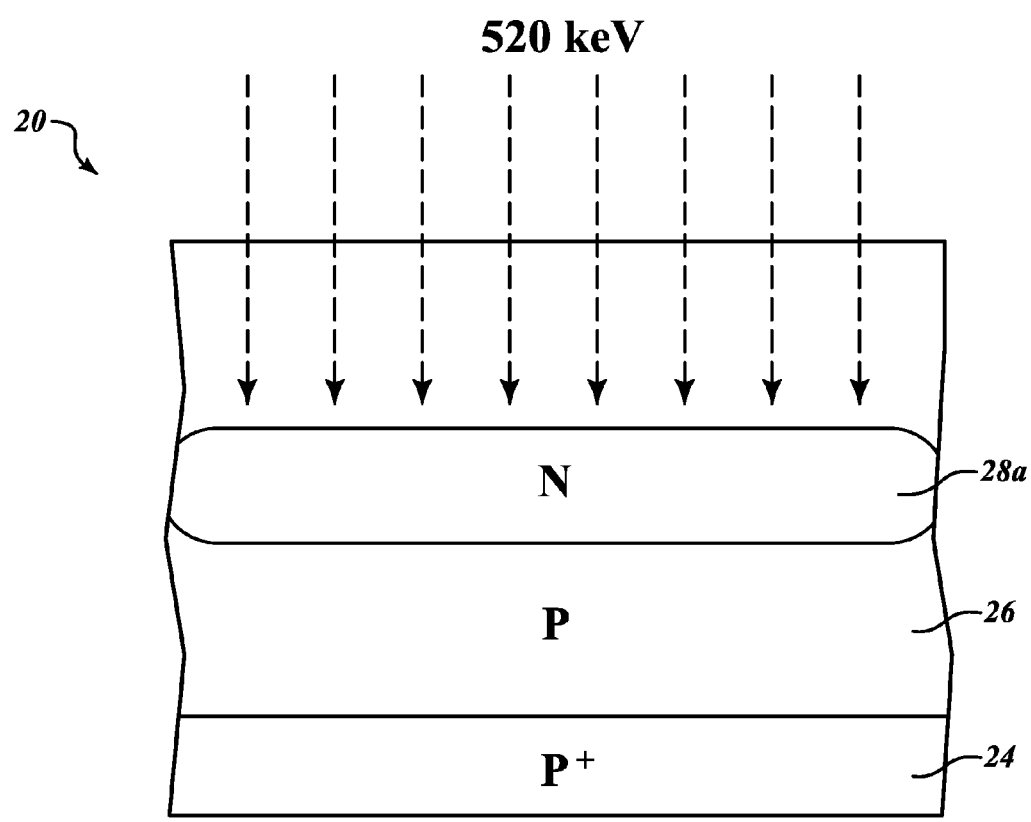
FIG. 2B is a cross-section of a trench MOSFET during a second body dopant implantation according to one embodiment.

FIG. 2B shows a first body region 28a having been doped with N type dopant ions in the implantation process illustrated in FIG. 2A. FIG. 2B further illustrates a second doping of the body region above the drain region above the first body region 28a. N type dopant ions are again implanted into the semiconductor substrate 20 by an ion implantation process similar to that described in relation to FIG. 2A.

In the example of FIG. 2B, phosphorus dopant ions are implanted in the semiconductor substrate 20 with an implantation energy of 520 keV. This is less than the ion implantation energy of 760 keV that was used in the first ion implantation process described in relation to FIG. 2A. Because the second ion implantation process illustrated in FIG. 2B has a lower energy than the first ion implantation process illustrated in FIG. 2A, the dopant ions of the second ion implantation process will not be driven as deeply into the semiconductor substrate 20 as were the dopant ions of the first process.

Figure 2C:
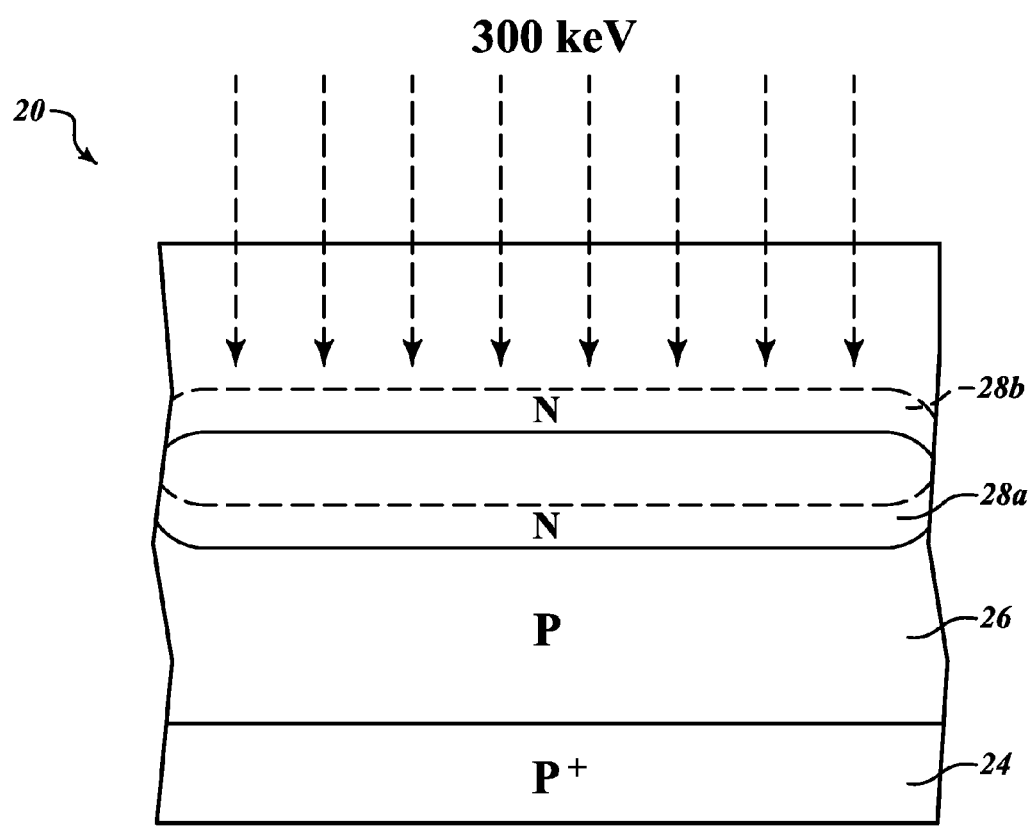
FIG. 2C is a cross-section of a trench MOSFET during a third body dopant implantation according to one embodiment.

FIG. 2C illustrates the second body region 28b which results from the second body implantation process illustrated with respect to FIG. 2B. The second body region 28b is outlined with dashed lines to distinguish it from the first body region 28a which is outlined with a solid line. As can be seen in FIG. 2C, the second body region 28b overlaps with the first body region 28a. This is because when dopant ions are implanted into the semiconductor substrate 20 with a particular implantation energy, some atoms are driven more deeply than others. The average depth to which the atoms are driven depends on the implantation energy. Ions implanted with a higher implantation energy will have a greater average depth then ions implanted with a low implantation energy. However, some of the ions will go much deeper than the average depth, while other ions will implant at a depth far shorter than the average that. Furthermore, after dopant plans are implanted in the semiconductor substrate 20, a diffusion process is performed by which the dopant atoms further diffuse. Thus, in FIG. 2C, the first and second body regions 28a, 28b overlap to a large extent.

FIG. 2C further illustrates a third doping of the body region above the second body region 28b. N type dopant ions are again implanted into the semiconductor substrate 20 by an ion implantation process similar to that described in relation to FIGS. 2A and 2B.

In the example of FIG. 2C, phosphorus dopant ions are implanted in the semiconductor substrate 20 with an implantation energy of 300 keV. This is less than the ion implantation energies of 760 and 520 keV that were used in the first and second ion implantation processes described in relation to FIGS. 2A and 2B. Because the third ion implantation process illustrated in FIG. 2C has a lower energy than the first and second ion implantation processes illustrated in FIGS. 2A and 2B, the dopant ions of the third ion implantation process will not be driven as deeply into the semiconductor substrate 20 as were the dopant ions of the first and second ion implantation processes.

Figure 2D:
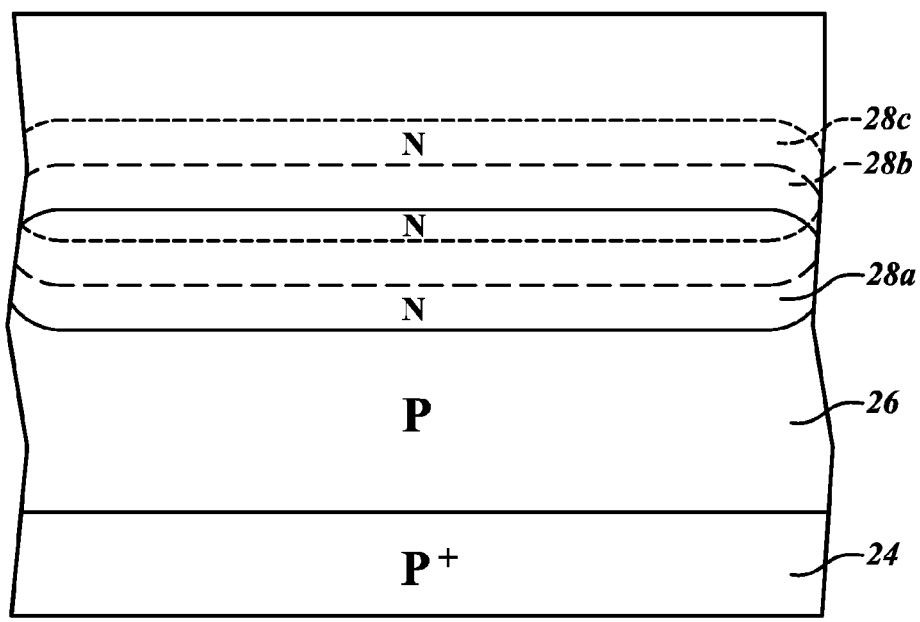
FIG. 2D is a cross-section of a trench MOSFET illustrating overlapping body dopant regions according to one embodiment.

FIG. 2D illustrates a third body region 28c which results from the third body implantation process illustrated with respect to FIG. 2C. The third body region 28c is outlined with shorter dashed lines to distinguish it from the first and second body regions 28a, 28b which are outlined with solid lines and larger dashed lines, respectively. As can be seen in FIG. 2D, the third body region 28c overlaps with the second body region 28b. The overlapping of the second and third body regions 28b, 28c results from both the variable depth at which ions of a given energy were implanted and diffusion of the dopant ions as described above in relation to FIG. 2C.

After the implant steps of FIGS. 2A-2C, the substrate is heated briefly towards the recrystallization temperature of the substrate and an anneal is carried out to cure defects created in the crystallized structure by the high energy ion implantation. During the anneal, the dopants diffuse in the substrate. It is preferred to carry out a single anneal after all implant steps to have less diffusion of the initial implant. Thus, all implants are carried out before the first heat and anneal steps. Alternatively, the substrate can be annealed to heal the defects immediately after each implant. In this event, care must be taken to not exceed the thermal budget of first or second implants.

Figure 1A:
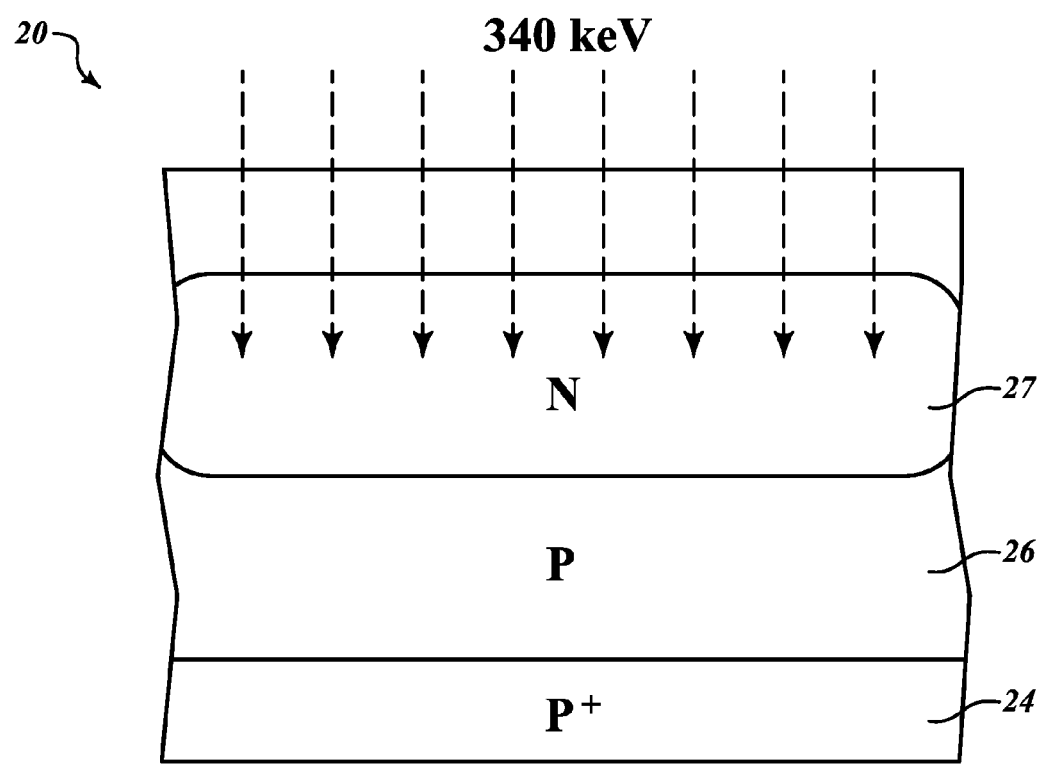
FIG. 1A is a cross-section of a trench MOSFET during implantation of dopants into the body region according to the prior art.
Figure 2E:
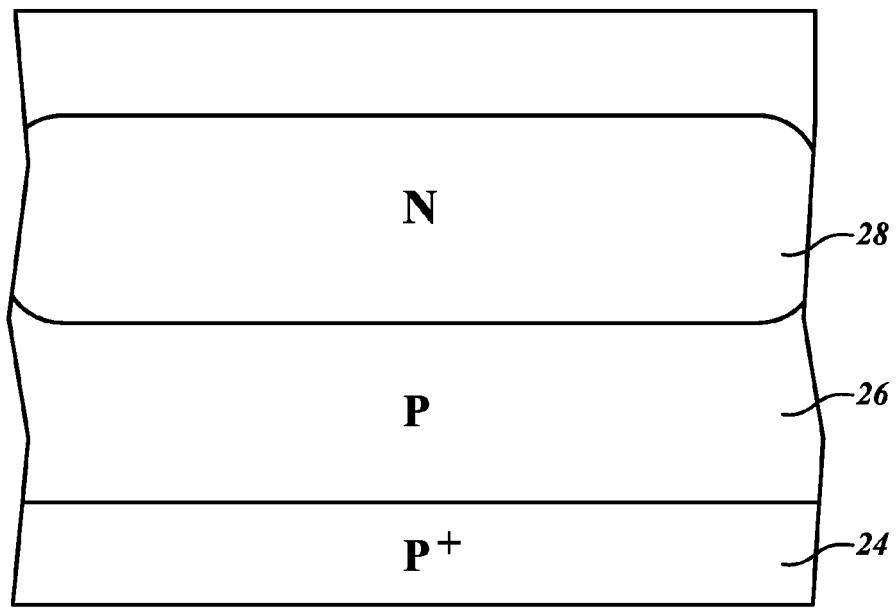
FIG. 2E is a cross-section of a trench MOSFET illustrating an aggregate body dopant region according to one embodiment.

FIG. 2E illustrates a single body region 28 which is the combination of the first second and third body regions 28a-28c. In contrast to the process described with relation to FIG. 1A in which a body region 27 was formed from a single ion implantation process, the body region 28 of FIG. 2E has been formed using multiple ion implantation steps each having different implantation energies. The body region 27 formed in FIG. 1A suffers from the drawback that the dopant concentration is highly uneven as a function of depth. The dopant concentration at the upper boundary of the body region 27 of FIG. 1A is relatively low with respect to the dopant concentration in the middle that of the body region 27 of FIG. 1A. The dopant concentration of the body region 27 of FIG. 1A gradually increases from the upper boundary toward the middle depth. The dopant concentration at the bottom boundary of the body region 27 of FIG. 1A is again much lower than at the middle depth of the body region 27 of FIG. 1A. The dopant concentration gradually decreases with depth from the middle depth to the bottom depth of the body region 27 FIG. 1A.

The highly uneven dopant concentration of the body region 27 of FIG. 1A can lead to many problems. One problem is that the channel region of the trench MOSFET is located where the body region is adjacent to the trench in which the gate electrode is positioned. The channel region extends in a vertical direction along the side wall of the trench. The uneven doping concentration in the channel region causes poor performance and unreliable electrical characteristics of the trench MOSFET.

In contrast, the body region 28 of FIG. 2E has a relatively constant doping concentration with depth. The doping concentration at the upper boundary of the body region 28 of FIG. 2E is approximately equal to doping concentration at the middle depth of the body region 28 of FIG. 2E. The doping concentration of the lower boundary of the body region 28 is approximately equal to the doping concentration at the middle depth of the body region 28 of FIG. 2E. This is because the body region 28 has been formed using multiple ion implantation steps and varying energies. After the several ion implantation steps diffusion processes cause the dopant ions from the several ion implantation steps to further diffuse throughout the body region 28 of the semiconductor substrate 20. The multiple ion implantation steps and diffusion processes result in a body region 28 having a relatively constant doping concentration throughout the various depths of the body region 28. The relatively constant doping concentration provides improved performance of the trench MOSFET and more reliable electrical characteristics of the trench MOSFET.

Figure 1B:
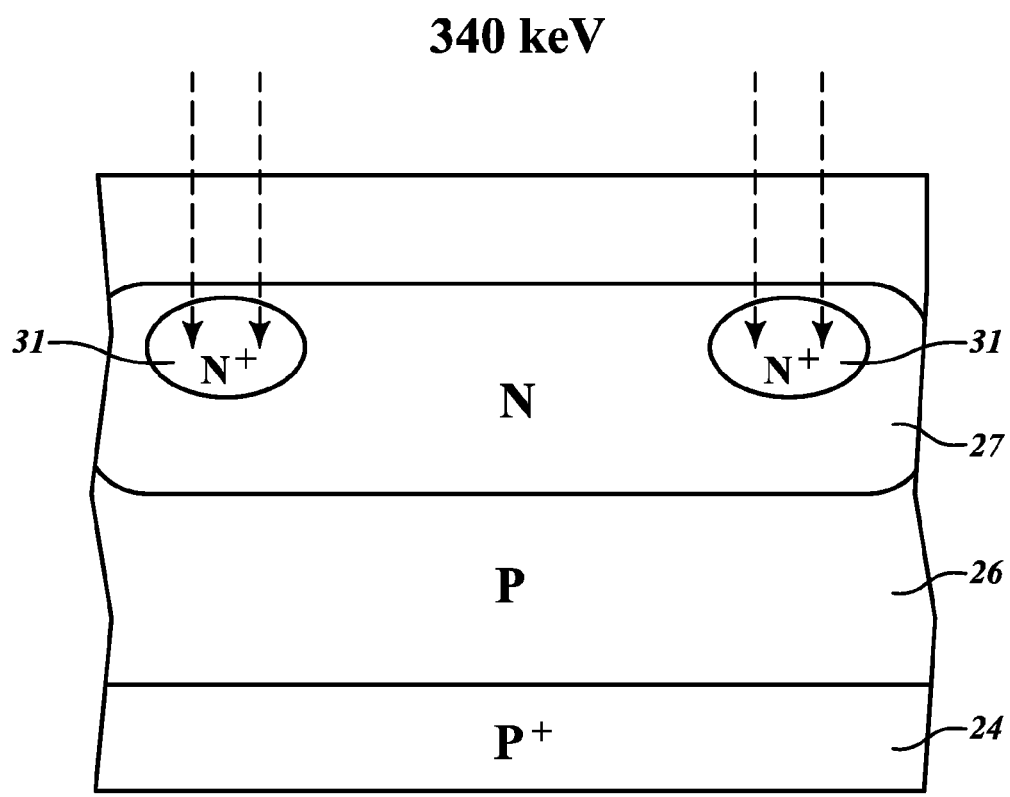
FIG. 1B is a cross section of a trench MOSFET during implantation of dopants to form a deep body region according to the prior art.
Figure 2F:
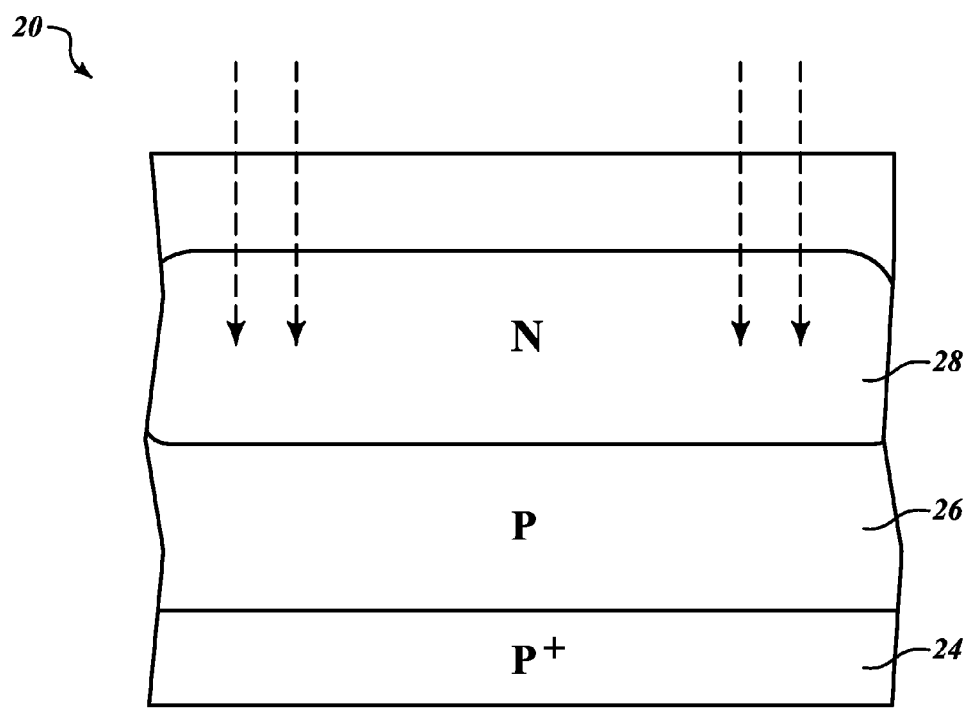
FIG. 2F is a cross-section of a trench MOSFET during implantation of dopant's to form a deep body region according to one embodiment.

FIG. 2F illustrates another ion implantation process in which dopant ions are implanted in the semiconductor substrate 20. In the process of FIG. 2F, a mask (not shown) is used on the surface of the semiconductor substrate so that the dopant ions are only implanted in particular portions of the semiconductor substrate 20. In the example illustrated in FIG. 2F, phosphorus ions are implanted with an implantation energy of 480 keV. This is in contrast to the ion implantation process shown with respect to FIG. 1B in which dopant ions were implanted with energy of 340 keV.

Figure 2G:
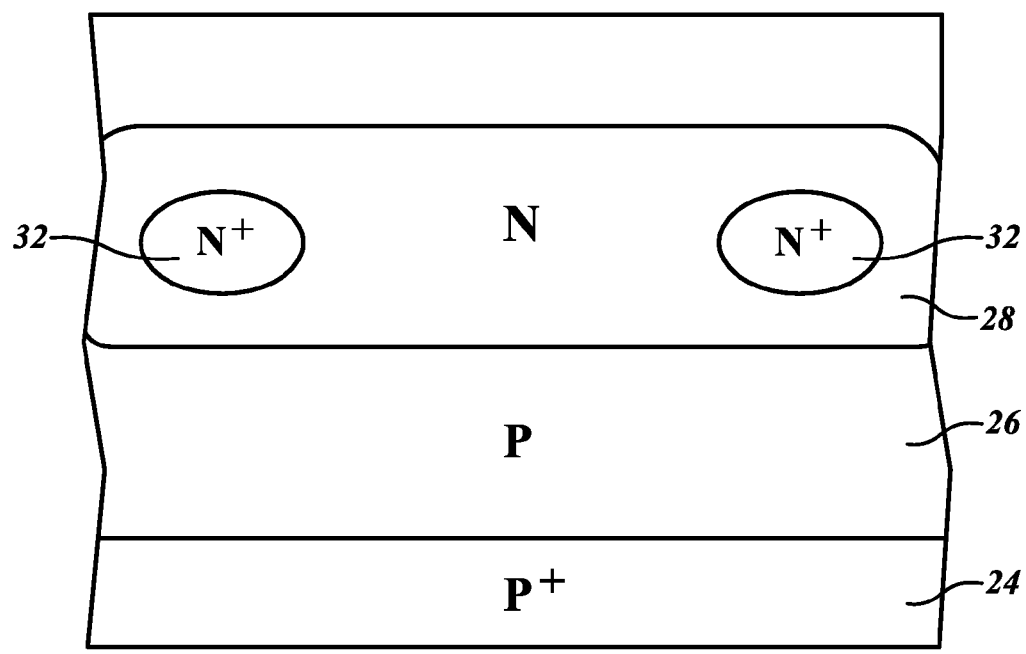
FIG. 2G is a cross-section of a trench MOSFET illustrating the body regions according to one embodiment.

FIG. 2G illustrates highly doped deep body implantation regions 32 within the body region 28. Because the deep body regions 32 were formed via an implantation process using a comparatively high implantation energy with respect to the process shown in FIG. 1B, the deep body regions 32 of FIG. 2G are deeper within the semiconductor substrate 20 than the deep body regions 31 of FIG. 1B.

One function of the deep body regions 32 is to provide an electric field shield which helps to determine where breakdown will occur if high voltages are applied to the trench MOSFET. Because the deep body regions 32 of FIG. 2G are deeper within the semiconductor substrate 20, breakdown will occur nearer the drain region 26. It is desirable for breakdown to occur in the drain region 26 rather than in the body region 28 as this will cause less damage to the trench MOSFET.

Figure 2H:
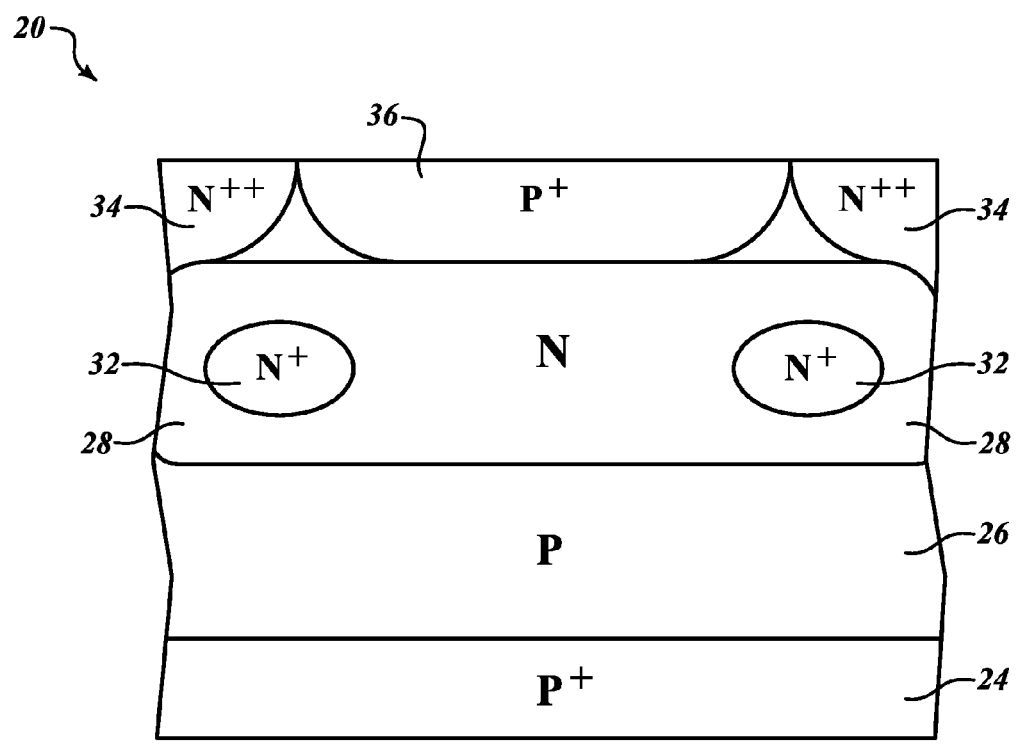
FIG. 2H is a cross-section of a trench MOSFET after formation of source regions and body contact regions according to one embodiment.

In FIG. 2H body contact regions 34 and source region 36 have been formed in the semiconductor substrate 20. The body contact region 34 is very highly doped with N type dopant ions. The source region 36 is highly doped with the opposite type dopant ions.

The body contact region 34 is highly doped and adjacent to the source region 36 to help ensure that the body region 28 of the trench MOSFET will be kept at the same voltage as the source region 36. As will be illustrated more clearly in relation to FIG. 2K, the source metallization is in contact both with the source region 36 and the body contact region 34. Selected voltages are applied to the source region 36 via the source metallization. Because the highly doped body contact region 34 is also in contact with the source metallization, the body region 28 and the source region 36 are held at the same voltage. Keeping the body region 20 and the source region 36 at the same voltage helps to prevent a parasitic bipolar transistor from being activated.

Figure 2I:
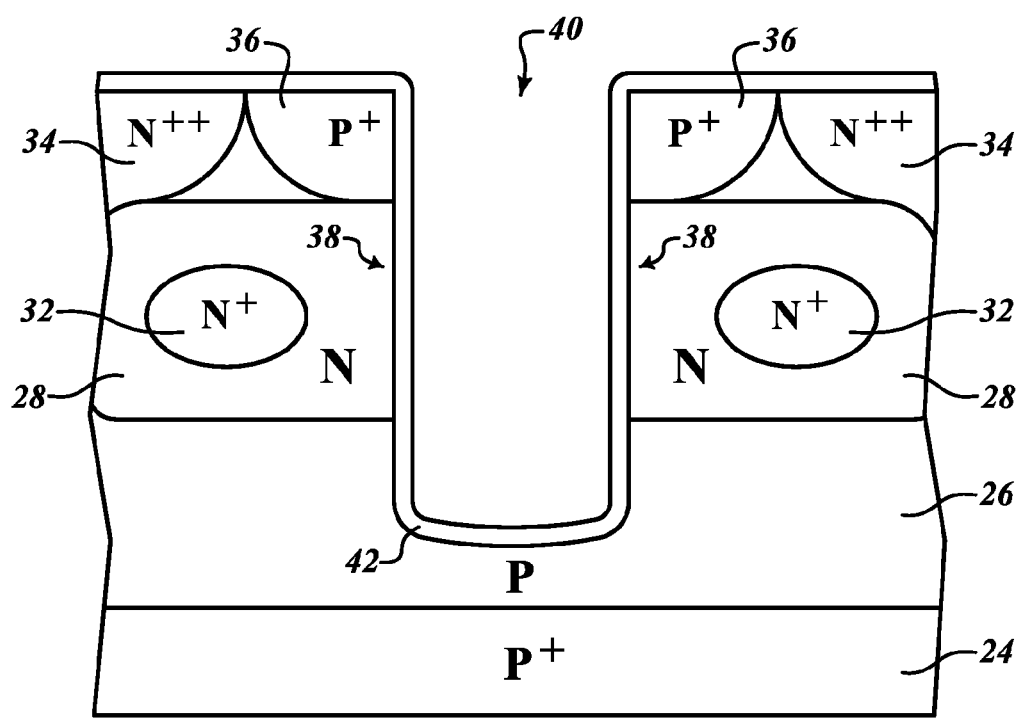
FIG. 2I is a cross-section of a trench MOSFET after formation of a trench according to one embodiment.

In FIG. 2I, the trench 40 of the trench MOSFET has been etched in the semiconductor substrate 20. The sidewalls of the trench 40 are lined with a gate dielectric 42. Channel regions of 38 are adjacent the sidewalls of the trench 40 in the body region 28.

Figure 1C:
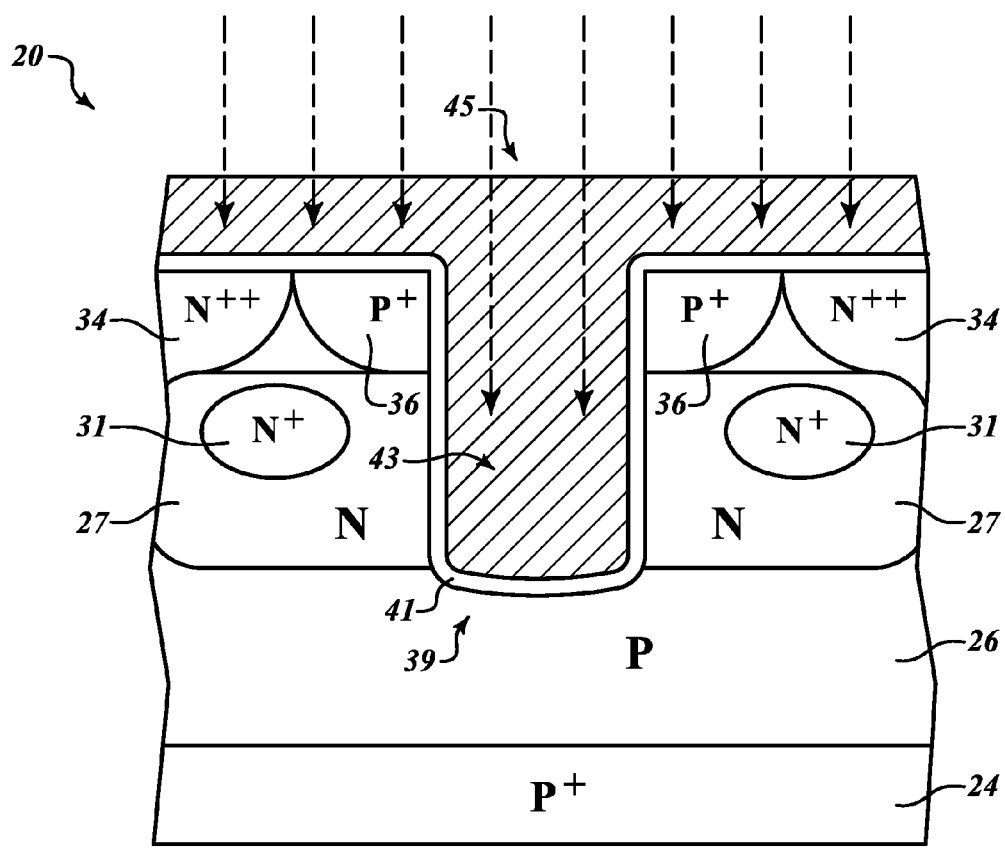
FIG. 1C is a cross-section of a trench MOSFET during implantation of dopant ions into a gate electrode according to the prior art.

The trench 40 of the trench MOSFET of FIG. 2I has a greater depth than the trench 39 of FIG. 1C. In particular, the trench 40 of FIG. 2I is about 1.7 μm deep. The trench 39 of FIG. 1C is about 1.3 μm deep. The trench 42 extends past the body region 28 and into the drain region 26. The increased depth of the trench 42 shifts the electric field Peak deeper into the drain region 26 and decreases the electric field overall.

The gate oxide 42 is about 400 Å thick. This is in contrast to the gate oxide 41 of FIG. 1C which is about 500 Å thick. The decreased thickness of the gate oxide 42 allows for a lower threshold voltage Vth of the trench MOSFET. This is because the threshold voltage Vth is proportional to the thickness of the gate oxide.

Figure 2J:
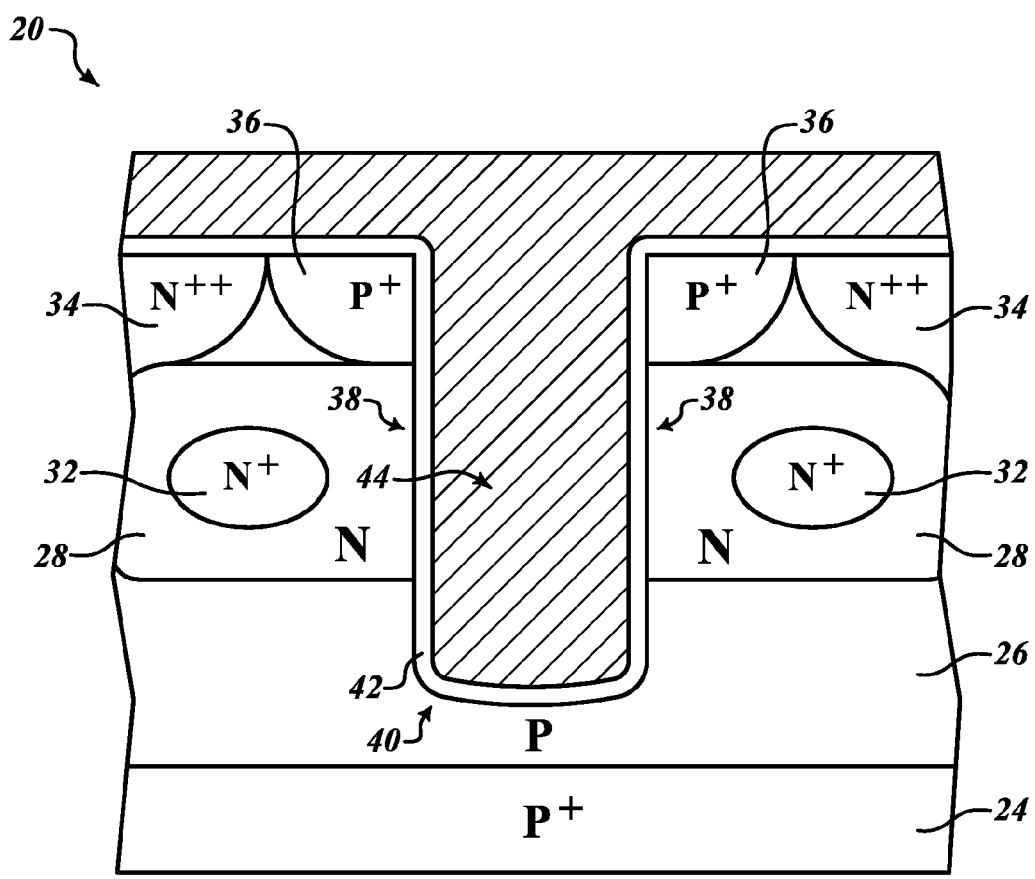
FIG. 2J is a cross-section of a trench MOSFET after formation of a gate electrode according to one embodiment.

In FIG. 2J a polysilicon gate electrode 44 has been deposited in the trench 40. Advantageously, the polysilicon gate electrode 44 has been doped in situ with N type dopant atoms. The increased depth of the trench 40 allows for the gate electrode 44 to be doped N type without adverse effect on the threshold voltage of the trench MOSFET. Because the gate electrode 44 is doped in situ with N-type dopants, the gate electrode 44 does not have to be doped via ion implantation as described in relation to FIG. 1C. Trench MOSFET of FIG. 2J can be formed without the drawbacks of the process described in relation to FIG. 1C. The gate oxide 42 does not need to undergo a nitridization process and there is no risk of the gate oxide 42 becoming contaminated with P type dopant because of the implantation and diffusion process. The gate electrode 44 does not undergo a diffusion process that moves the dopant locations at all because the gate electrode 44 is doped in situ.

Figure 2K:
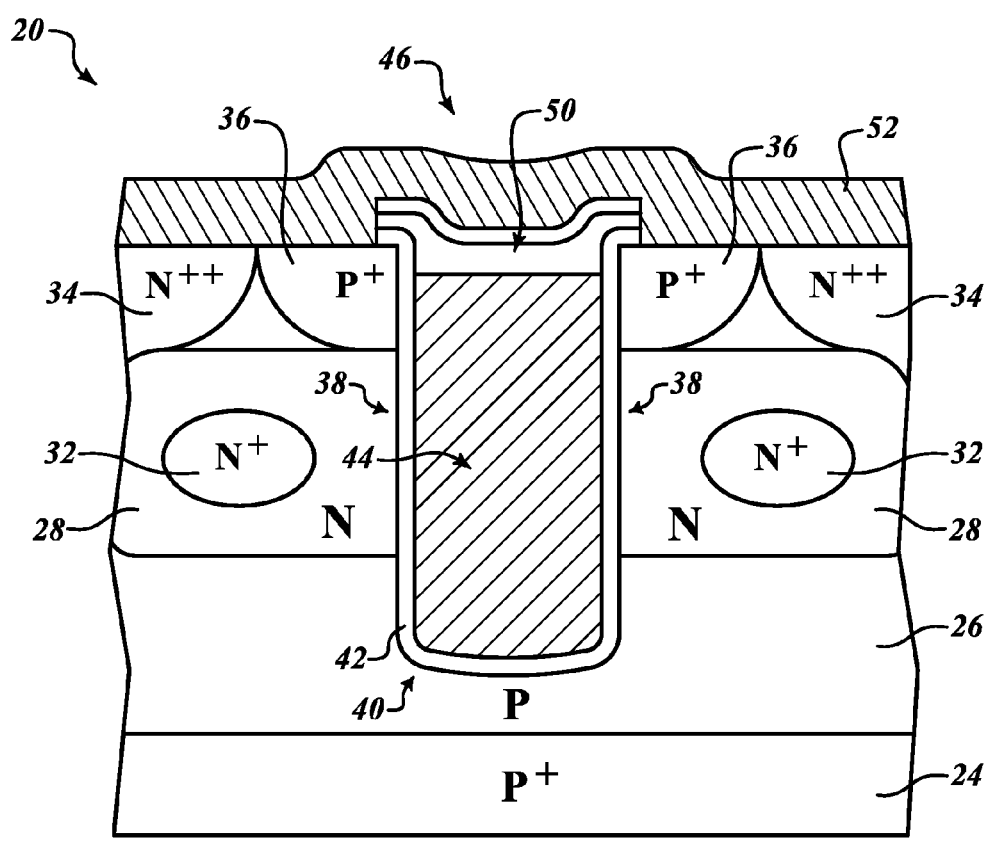
FIG. 2K is a cross-section of a trench MOSFET after formation of a source metallization according to one embodiment.

In FIG. 2K illustrates a completed trench MOSFET 46. The gate electrode 44 has been etched back and a dielectric structure 50 has been formed thereon. A source metal 52 has been deposited on the source regions 36 and the body contact regions 34. The source metal 52 is separated from the gate electrode 44 by the dielectric structure 50. The dielectric 50 can be a first layer of $SiO_2$, such as a TEOS or HDCVD formed oxide. Overlying this, a dense layer of $Si_3N_4$ can be formed to fully seal and isolate the gate electrode 44 from the source metal 52.

As described previously, the source metal 52 is in contact with both the body contact regions 34 and the source regions 36. This ensures that the body region 28 and the source region 36 are held at the same voltage, preventing activation of a parasitic bipolar transistor.

A contact to the gate electrode 44 is formed by any acceptable technique. An opening with appropriate masking can be formed through the source metal 52 and the dielectric structure 50 to be in physical and electrical contact with the gate electrode. Alternatively, the gate electrode 44 can be contacted out of plane from the location shown in FIG. 2K, where the source metal does not overlay the gate electrode 44.

The trench MOSFET 46 functions by applying a high voltage to the source metal 52 and a low voltage to the drain 24 by means of a drain metal contact on the bottom of the semiconductor substrate 20, or alternatively by a buried contact from the top side, out of plane. The drain metal is not illustrated in the figures. The trench MOSFET 46 can be turned on by applying a low voltage to the gate electrode 44. This causes a current to flow from the source region 36 through the Channel regions 38 adjacent the gate electrode 44 and down to the drain region 24. The trench MOSFET 46 has many advantages over previous trench MOSFETs as described previously.

While trench MOSFET 46 has been described as a P channel trench MOSFET, those of skill in the art will understand that an N-channel trench MOSFET having many advantages can also be manufactured according to principles of the present disclosure by using opposite doping schemes. The particular layers that exhibit doping concentrations are given by way of example only and can be altered in many ways, as will be apparent to those of skill in the art, without departing from the scope of the present disclosure.

Figure 3:
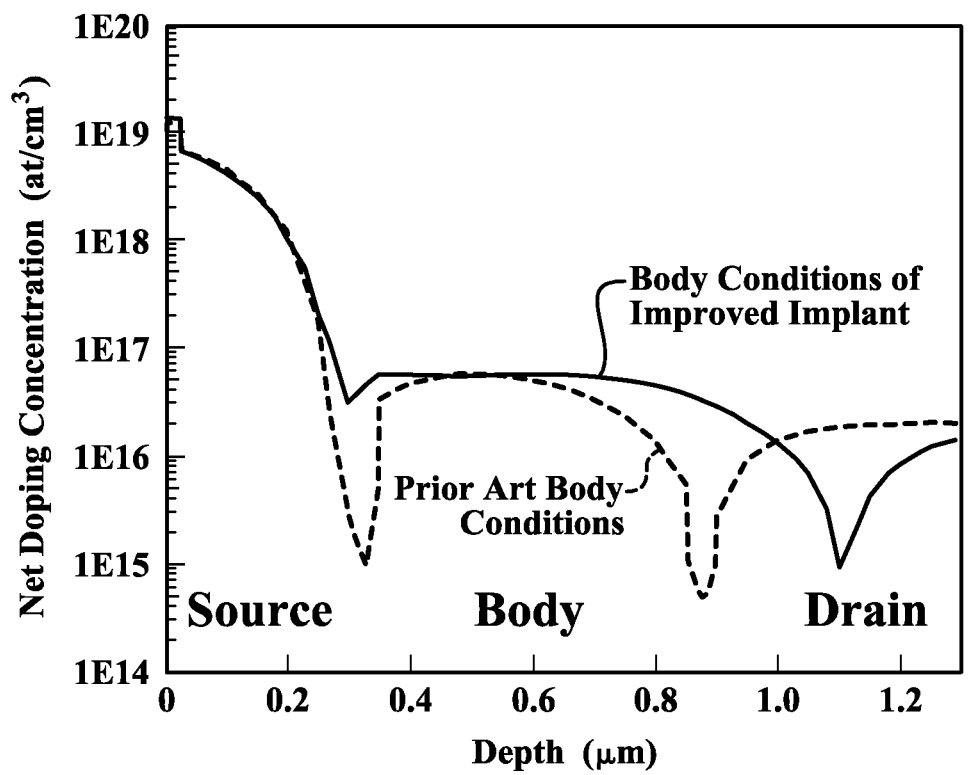
FIG. 3 is a graph of doping concentration versus depth according to one embodiment.

FIG. 3 is a graph illustrating the doping concentration of the trench MOSFET as a function of depth. The doping concentration of the inventive trench MOSFET 46 according to FIGS. 2A-2K is denoted with a solid line. The doping concentration of the prior art trench MOSFET 45 described in relation to FIG. 1C is denoted with a dashed line. The doping concentrations of both trench MOSFETs 45 and 46 are high and substantially the same in the source region. However, in the body region the doping concentration profile of the trench MOSFETs 45 and 46 differs substantially. As can be seen, trench MOSFET 45 has a highly uneven doping concentration in the body region. In contrast, the trench MOSFET 46 has a substantially flat doping concentration across the body region. This results in many beneficial characteristics for the trench MOSFET 46 as described previously.

In the inventive trench MOSFET 46, the interface between the source and drain occurs at a greater depth as can be seen in the graph of FIG. 3. Further, the body region is much wider and extends to a greater depth.

Of course, it is possible to use the inventive techniques and have a shorter gate length, namely a shorter distance between the source and drain. This can be accomplished by driving the source deeper so that the distance between the source and drain is shorter, if desired.

Figure 4A:
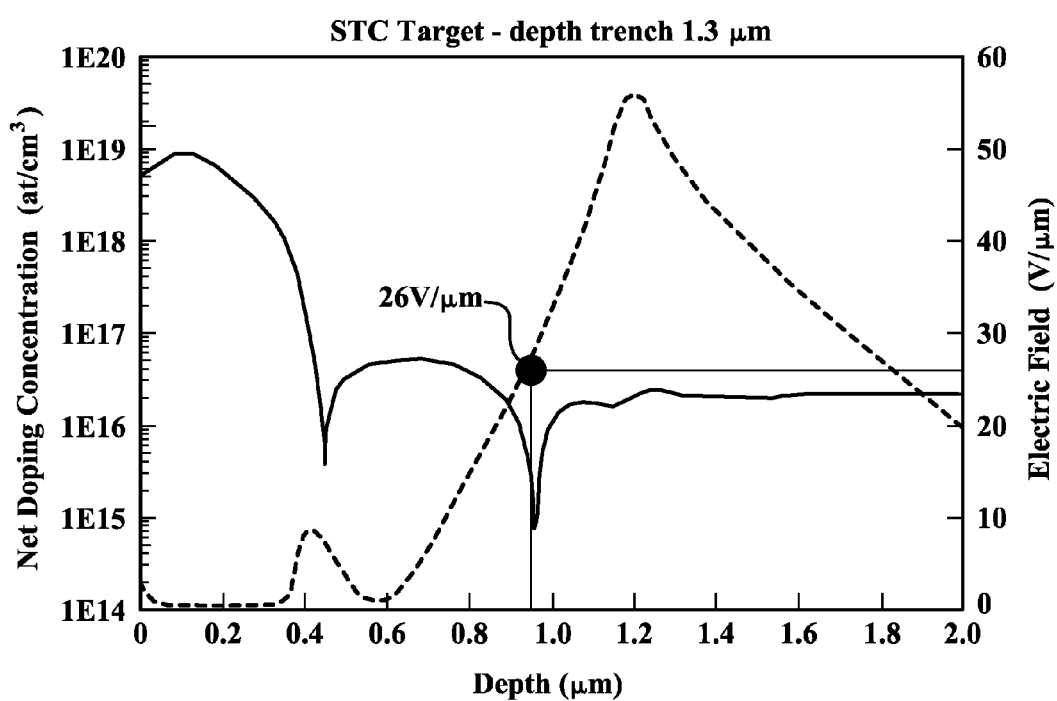
FIG. 4A is a graph illustrating doping concentration and electric field versus depth for a trench MOSFET.

FIG. 4A illustrates a graph of the net doping concentration and electric field strength for the prior art trench MOSFET 45 of FIG. 1C. The doping concentration is denoted with the solid line while the electric field is the noted with the dashed line. As can be seen, the electric field at the bottom of the drain region (at a depth of about 1 μm) is about 26 volts/μm.

Figure 4B:
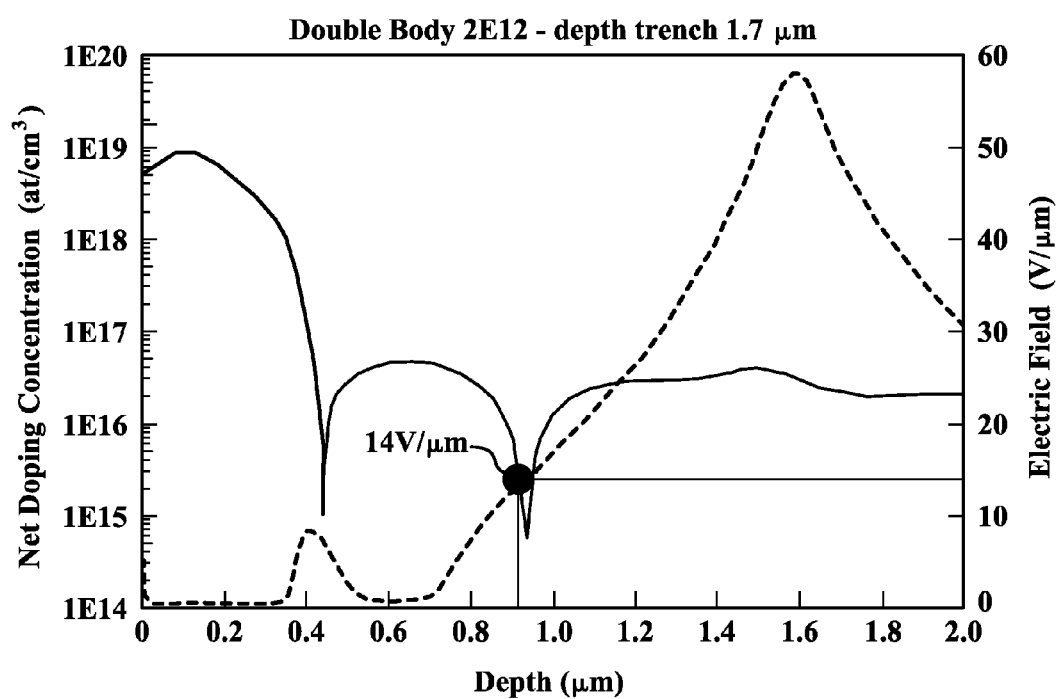
FIG. 4B is a graph illustrating doping concentration and electric field versus depth for trench MOSFET according to one embodiment.

FIG. 4B illustrates a graph of the net doping concentration and electric field strength for the inventive trench MOSFET 46 of FIG. 2K. The doping concentration is denoted with the solid line while the electric field is the noted with the dashed line. As can be seen, the electric field at the bottom of the drain region (at a depth about 1 μm) of the trench MOSFET 46 is about 14 volts/μm. The electric field at the bottom of the drain region of the trench MOSFET 46 is reduced with comparison to that of the trench MOSFET 45. As described previously this allows for more reliable performance and electrical characteristics of the trench MOSFET 46.

Figure 5:
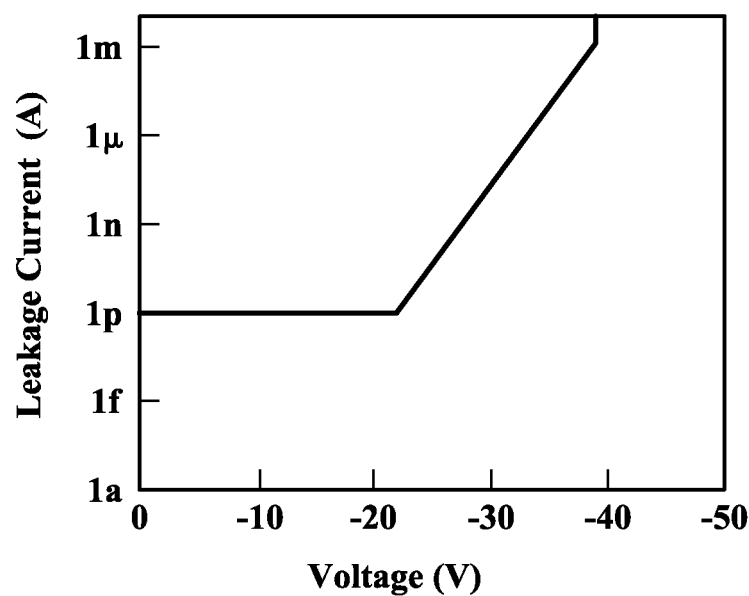
FIG. 5 is a graph illustrating leakage current through a junction versus voltage according to one embodiment.

FIG. 5 is a graph illustrating the leakage current of the trench MOSFET 46 versus the reverse bias voltage which can erroneously be applied sometimes to the trench MOSFET 46. As can be seen, until about 22 V, the leakage current is very small at about 1 pA. At about 22 volts breakdown occurs and the term begins to increase very rapidly. Because the deep body region 32 of the trench MOSFET 46 is a much deeper in the body region 28 then the deep body region 31 of the trench MOSFET 45 breakdown voltage is much larger for the trench MOSFET 46. Furthermore breakdown occurs further into the drain region of the trench MOSFET 46 which reduces the damage done to the trench MOSFET 46 in the unlikely event of breakdown.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of forming a trench MOSFET, the method comprising:
    forming a drain region in a semiconductor substrate;
    forming a body region in the semiconductor substrate above the drain region, forming the body region including:
        implanting dopant atoms in the body region of the semiconductor substrate with a first implantation energy;
        implanting dopant atoms in the body region of the semiconductor substrate with a second implantation energy; and
        implanting dopant atoms in the body region of the semiconductor substrate with a third implantation energy; and
        implanting dopant atoms in the body region of the semiconductor substrate with a fourth implantation energy;
    implanting dopant atoms in a source region of the semiconductor substrate above the body region; and
    forming a trench in the semiconductor substrate, a sidewall of the trench abutting the source, body, and drain regions, the body region having a substantially constant doping concentration along the sidewall of the trench between the source and drain regions.

2. The method of claim 1 comprising forming a gate dielectric layer on the sidewall of the trench.

3. The method of claim 2 comprising forming a gate electrode in the trench adjacent the gate dielectric.

4. The method of claim 3 comprising:
    forming the gate electrode of polysilicon; and
    doping the gate electrode in situ.

5. The method of claim 1 wherein the dopant atoms implanted with the fourth implantation energy form a deep body region of the trench MOSFET.

6. The method of claim 1 wherein the trench MOSFET is a PMOS transistor.

7. The method of claim 1 wherein the trench is deeper than 1.5 μm.

8. A trench MOSFET comprising:
    a drain region in a semiconductor substrate;
    a body region in the semiconductor substrate above the drain region;
    a deep body region that includes dopant atoms;
    a source region in the semiconductor substrate above the body region; and
    a trench in the semiconductor substrate, a sidewall of the trench abutting the source, body, and drain regions, the body region having a substantially constant doping concentration along the sidewall of the trench between the source and drain regions.

9. The trench MOSFET of claim 8 comprising a gate dielectric layer on the sidewall of the trench.

10. The trench MOSFET of claim 9 comprising a gate electrode in the trench adjacent the gate dielectric.

11. The trench MOSFET of claim 10 wherein the trench MOSFET is a P channel transistor and the gate electrode is polysilicon.

12. The trench MOSFET of claim 10 wherein the polysilicon is doped with N type dopant atoms.

13. The trench MOSFET of claim 8 wherein the trench is deeper than 1.5 μm.

14. A method comprising:
   forming a drain region in a semiconductor substrate by implanting P type dopant ions into the semiconductor substrate;
   forming a body region in the semiconductor substrate above the drain region by implanting N type dopant ions into the semiconductor substrate;
   forming a deep body region in the semiconductor substrate by implanting additional N type dopant ions into the semiconductor substrate,
   forming a source region in the semiconductor substrate by implanting P type dopant atoms in the semiconductor substrate above the body region;
   forming a trench in the semiconductor substrate, a sidewall of the trench abutting the source, body, and drain regions, the body region having a substantially constant doping concentration along the sidewall of the trench between the source and drain regions;
   filling the trench with a gate electrode; and
   doping the gate electrode with N type dopant atoms.

15. The method of claim 14 wherein doping the gate electrode comprises doping the gate electrode in situ.

16. The method of claim 14 wherein the dopant atoms are implanted to form a deep body region of the trench MOSFET.

17. The method of claim 14 wherein the trench is deeper than 1.5 μm.

* * * * *